(12) United States Patent
Mettry et al.

(10) Patent No.: US 10,800,671 B2
(45) Date of Patent: Oct. 13, 2020

(54) FUNCTIONALIZED SOLID PARTICLES FOR SEQUESTERING METAL IONS

(71) Applicant: International Business Machines Corporation, Armonk, NY (US)

(72) Inventors: Magi Mettry, San Jose, CA (US); Rudy J. Wojtecki, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 16/191,546

(22) Filed: Nov. 15, 2018

(65) Prior Publication Data

US 2020/0156961 A1 May 21, 2020

(51) Int. Cl.
| | |
|---|---|
| C02F 1/28 | (2006.01) |
| G03F 7/26 | (2006.01) |
| C08F 4/40 | (2006.01) |
| G03F 7/32 | (2006.01) |
| G03F 7/40 | (2006.01) |
| G03F 7/038 | (2006.01) |

(52) U.S. Cl.
CPC .............. *C02F 1/286* (2013.01); *C08F 4/40* (2013.01); *G03F 7/038* (2013.01); *G03F 7/265* (2013.01); *G03F 7/32* (2013.01); *G03F 7/405* (2013.01)

(58) Field of Classification Search
CPC . C02F 1/286; G03F 7/265; G03F 7/32; G03F 7/405; G03F 7/038; C08F 4/40
See application file for complete search history.

(56) References Cited

U.S. PATENT DOCUMENTS

| 8,986,924 B2 | 3/2015 | Shukla et al. |
| 2016/0225471 A1 | 8/2016 | Holliday |

FOREIGN PATENT DOCUMENTS

| CN | 107744798 A | 3/2018 |
| JP | 2003147015 A | 5/2003 |
| JP | 4747399 B2 | 8/2011 |

OTHER PUBLICATIONS

Aseyev et al., "Non-ionic Thermoresponsive Polymers in Water", Adv Polym Sci (2011) 242: 29-89.
Demirbas et al., "Adsorption of Cu(II), Zn(II), Ni(II), Pb(II), and Cd(II) from aqueous solution on Amberlite IR-120 synthetic resin", Journal of Colloid and Interface Science, vol. 282, Issue 1, Feb. 1, 2005, Abstract.
Futalan et al., "Comparative and competitive adsorption of copper, lead, and nickel using chitosan immobilized on bentonite", Carbohydrate Polymers, vol. 83, Issue 2, Jan. 10, 2011, Abstract.

(Continued)

*Primary Examiner* — Taiwo Oladapo
(74) *Attorney, Agent, or Firm* — Michael R. Roberts

(57) ABSTRACT

Metal ion sequestering particles were formed in a one-pot single step synthesis by azeotropically removing water while heating a reaction mixture containing a branched poly (ethylenimine), poly(acrylic acid), di-(2-picolylamine), a catalytic amount of N,N-duimethylformamide, toluene, and either glycine or a carboxy-terminated poly(N-isopropylacrylamide). No other catalyst was present. The branched and crosslinked particles formed using the poly(N-isopropylacrylamide) sequestered metal ion from water at ambient temperature and released the bound metal ion upon heating.

27 Claims, 11 Drawing Sheets

(56) References Cited

OTHER PUBLICATIONS

Krasermann et al., "Self-assembled polyelectrolyte multilayer membranes with highly improved pervaporation separation of ethanol/water mixtures", Journal of Membrane Science, vol. 181, Issue 2, Jan. 30, 2001, Abstract.
Li et al., "Preparation of macroporous bead adsorbents based on poly(vinyl alcohol)/chitosan and their adsorption properties for heavy metals from aqueous solution", Chemical Engineering Journal 178 (2011) 60-68.
Mishra et al., "Removal of lead and zinc ions from water by low cost adsorbents", Journal of Hazardous Materials, vol. 168, Issue 1, Aug. 30, 2009, Abstract.
Mohan et al., "Single- and multi-component adsorption of cadmium and zinc using activated carbon derived from bagasse—an agricultural waste", Water Research vol. 36, Issue 9, May 2002, Abstract.
Pomogailo et al., "Monomeric and Polymeric Carboxylic Acids", Chapter 2, Macromolecular Metal Carboxylates and Their Nanocomposites, Springer Series in Materials Science 138, DOI 10.1007/978-3-642-10574-6 2, copyright Springer-Verlag Berlin Heidelberg, 2010, pp. 7-25.
Samiey et al., "Organic-Inorganic Hybrid Polymers as Adsorbents for Removal of Heavy Metal Ions from Solutions: A Review", Materials 2014, 7, 673-726.
Sengil et al., "Competitive biosorption of Pb , Cu and Zn ions from aqueous solutions onto valonia tannin resin", Journal of Hazardous Materials vol. 166, Issues 2-3, Jul. 30, 2009, Abstract.

FUNCTIONALIZED SOLID PARTICLES FOR SEQUESTERING METAL IONS

BACKGROUND

The present invention relates to functionalized solid particles for sequestering metal ions, and more specifically, to removing metal ion contaminants from water.

Water contamination with heavy metal ion and alkaline earth metal ions (i.e., ions of Group II elements of the periodic table, in particular magnesium (Mg), calcium (Ca), strontium (Sr), and barium (Ba)) is a serious threat to our ecosystem worldwide. While other water pollution can be biodegradable and less harmful, heavy metal ions are toxic and can lead to various diseases at low concentrations. For example, the concentration of $Zn^{+2}$ and $Cu^{+2}$ for human intake should not to exceed 2-3 mg/L. Many water sources remain contaminated with relatively high levels of these metal ions; therefore, the sequestering and removal of heavy metal ions are essential for environmental safety and public health.

A multitude of methods and techniques have been developed in pursuit of removing a variety of cations and anions, including transition metal ions, from brine solutions. For decades, adsorption, ion exchange resins, and reverse osmosis (RO) have been the main techniques used for water treatment. Adsorption relies heavily on high pressures, which is costly and non-reversible. The use of ion exchange resins requires process-dependent material and harsh chemical additives such as strong acids and bases for performance, resulting in high costs and poor efficiencies. Reverse osmosis (RO) systems are effective filtration processes utilizing a semipermeable membrane to remove metal ions, molecules, and large particles from a brine solution. However, the RO process is not selective and leads to excessive amounts of rejected metal ion-rich water waste. Furthermore, the semipermeable membranes are not recyclable.

The above-mentioned technologies lack selectivity, efficiency, and/or recyclability. As a result of these technological deficiencies, there is a need to develop a cost efficient and regenerative material that utilizes molecular selectivity for mono/divalent metal ions to purify water at high and low concentration of metal ions.

SUMMARY

Accordingly, a particle is disclosed, comprising:
a branched polymer network, the polymer network comprising i) a first moiety comprising a covalently bound form of a poly(ethylenimine) (PEI), ii) a second moiety comprising a covalently bound form of a polyacid, the polyacid comprising carboxylic acid groups, iii) a third moiety comprising a covalently bound form of di-2-picolylamine, and iv) a fourth moiety comprising a covalently bound form of an amino acid;
wherein
the first moiety, second moiety, third moiety, and fourth moiety are covalently bound to the polymer network.

Also disclosed is a particle, comprising:
a branched polymer network comprising i) a first moiety comprising a covalently bound form of a poly(ethylenimine) (PEI), ii) a second moiety comprising a covalently bound form of a polyacid, the polyacid comprising a pendant carboxylic acid group, iii) a third moiety comprising a covalently bound form of di-2-picolylamine; and iv) a fourth moiety comprising a covalently bound form of a thermoresponsive polymer having a critical solution temperature in water;
wherein
the first moiety, the second moiety, the third moiety, and the fourth moiety are covalently bound to the branched polymer network.

Also disclosed is a method, comprising:
forming a mixture comprising a poly(ethylenimine), a polyacid comprising a pendant carboxylic acid group, di-2-picolylamine, glycine, a solvent, and a catalytic amount of N,N-dimethylformamide based on total moles of carboxylic acid of the mixture; and
heating the mixture while removing water, thereby forming a branched polymer network comprising a covalently bound form of each of the poly(ethylenimine), the polyacid, the di-2-picolylamine, and the glycine.

Further disclosed is a method, comprising:
forming a mixture comprising a poly(ethylenimine), a polyacid comprising a pendant carboxylic acid group, di-2-picolylamine, a thermoresponsive polymer having a critical solution temperature in water, a solvent, and a catalytic amount of N,N-dimethylformamide; and
heating the mixture while removing water, thereby forming a branched polymer network, wherein the poly(ethylenimine), the polyacid, the di-2-picolylamine, and the thermoresponsive polymer are covalently bound to the polymer network.

Also disclosed is a method, comprising:
contacting the above-described particle with an aqueous mixture comprising a metal ion, thereby forming a metal ion complex, wherein the metal ion complex comprises the metal ion bound non-covalently to the particle.

Further disclosed is a polymer network, comprising:
(i) a first repeat unit comprising an amine;
(ii) a second repeat unit comprising a carboxylic acid; and
(iii) a third repeat unit comprising an amide of di-2-picolylamine;
wherein
the polymer network comprises polymer chains crosslinked by amide-containing crosslink groups,
the first repeat unit, the second repeat unit, and the third repeat unit are covalently bound to the polymer network, and
the polymer network is capable of sequestering metal ions from aqueous solution.

The above-described and other features and advantages of the present invention will be appreciated and understood by those skilled in the art from the following detailed description, drawings, and appended claims.

DETAILED DESCRIPTION

Figure 1:
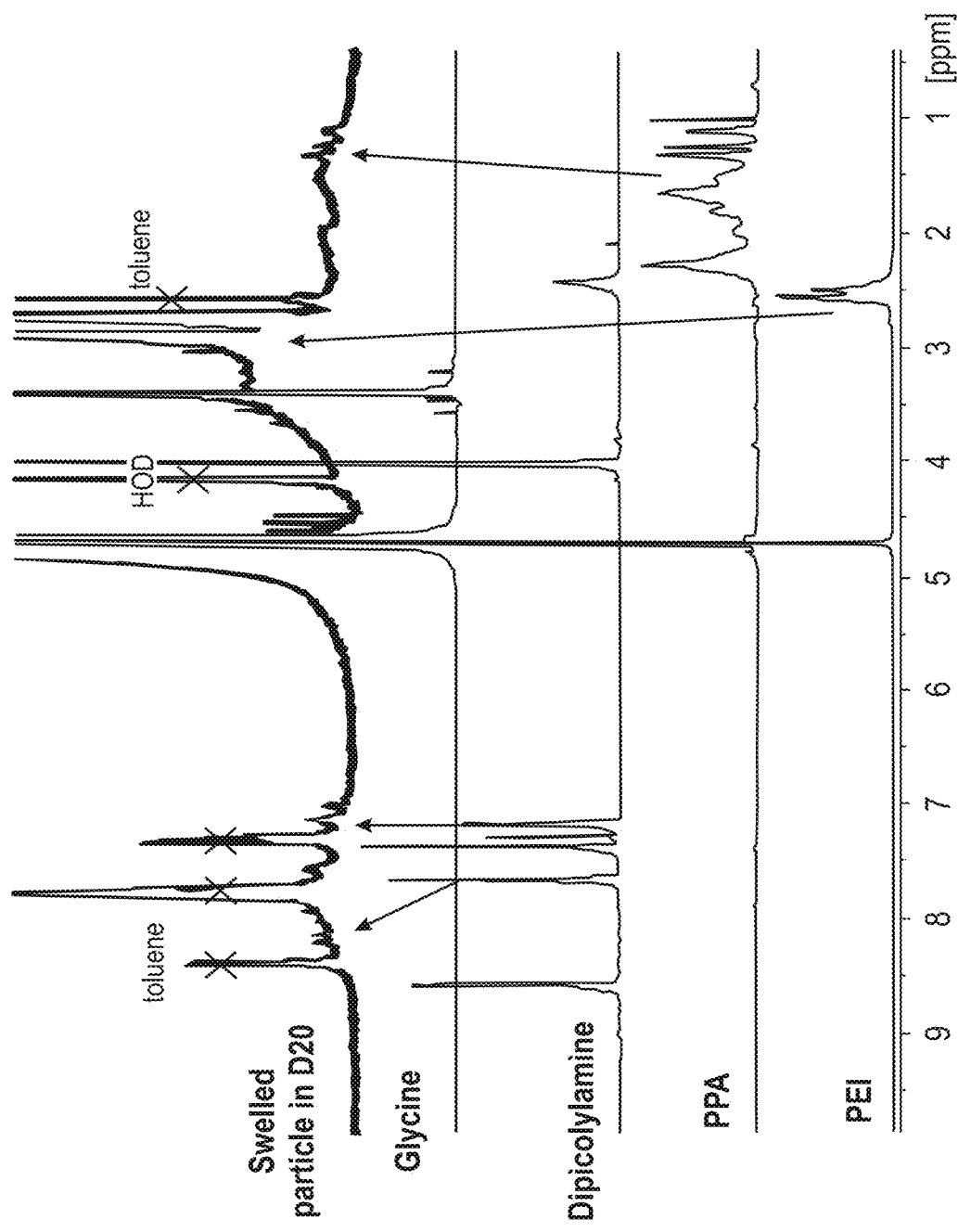
FIG. 1 is a $^1H$ NMR spectrum of functionalized solid particle FSP-1 in $D_2O$. Peaks corresponding to residual toluene and DMF solvent are indicated.

Disclosed are branched, crosslinked, zwitterionic polymer particles, methods of preparing the particles, and methods of their use. The particles have surface pore sizes in the range of 10-40 micrometers and are swellable in water. The water-swollen polymer particles are capable of sequestering dissolved metal ions from aqueous solution by non-covalent interactions in the form of less water-compatible metal ion complexes. The sequestration can be performed in a batch mode, by a filtration process, or combination thereof. The metal ion complexes can be separated from the aqueous phase by filtration and/or centrifugation. The metal ion complexes can also include counterions of the metal ions bound to the polymer particles by non-covalent interactions. The metal ion complexes are capable of releasing the bound metal ion(s) and counterion(s) under controlled conditions mediated by, for example, pH and/or temperature. In some instances, the initial polymer particles and their metal ion complexes exhibit thermoresponsive properties in water, which can be favorably utilized to release the bound metal ion(s) by simply heating (or cooling) the metal ion complexes in water. The disclosed polymer particles can be prepared in a single step, "one-pot" procedure.

Method 1

In Method 1, the disclosed particles are formed by heating, with removal of water, a mixture comprising a polyamine (preferably a poly(ethyleneimine) (PEI), more preferably a branched PEI), a polycarboxylic acid (e.g., poly(acrylic acid)), an amine compound capable of forming an amide and a metal ion complex (e.g., di-2-picolylamine), an amino acid (e.g., glycine), a solvent, and a catalyst for amide formation (e.g., dimethylformamide (DMF)). Preferably, the solvent forms an azeotrope with water, allowing removal of the water at the boiling point of the azeotrope as the crosslinked polymer particles are formed. Amide-containing crosslinking groups that link the polyamine and polycarboxylic acid can be formed by a condensation reaction of carboxylic acid groups of the polycarboxylic acid with primary and/or secondary amine groups of the polyamine. In an embodiment, the polycarboxylic acid is a homopolymer of a carboxylic acid-containing monomer. The amide-containing crosslinking groups of the network can also be formed by the reactions of the amine and carboxylic acid groups of glycine with, respectively, the carboxylic acid groups of the polyacid and the amine groups of the polyamine.

Amide groups of the disclosed particles can also result from transamidation reactions (i.e., reaction of an initial amide group with an amine or carboxylic acid, generating a second amide group and releasing the amine or carboxylic acid of the initial amide group).

The particles formed by the reaction of Method 1 comprise a branched and crosslinked polymer network. The polymer network comprises a polyamine portion and a polyacid portion covalently linked via amide-containing bridging groups. The polymer network further comprises pendant amine groups and/or amine groups of the polymer backbone, pendant carboxylic acid groups, and pendant di-2-picolylamide groups:

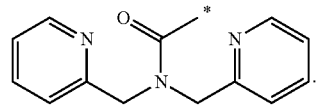 [SMILES: CC(=O)N(Cc1ccccn1)Cc1ccccn1]

Herein, an atomic center of a chemical structure that is shown bonded to an asterisk (e.g., the above carbonyl carbon) is covalently linked to another unspecified atomic center of the chemical structure represented by the asterisk.

The network can further comprise a poly(glycine) portion (i.e., polyamide) generated by self-polymerization of glycine, which is linked at one or both ends of the poly(glycine) chain to the polyamine and/or polycarboxylic acid by an amide-containing group.

The end groups of the disclosed particles can comprise any of the foregoing amine and carboxylic acid pendant groups, as well as end groups of the initial polyamine and polycarboxylic acid materials.

As an example, a fully functionalized solid particle made with a 3:1 molar ratio of glycine and dipicolylamine can sequester metal ions up to 2.6 times the particle weight. Both the hydrophilic polymer components and the rich N-donor sites help swell the particle and bind metal cations as well as their counterions in water.

Method 2

In Method 2, the disclosed particles are formed by heating, with removal of water, a mixture comprising a polyamine (preferably a poly(ethyleneimine) (PEI), more preferably a branched PEI), a polycarboxylic acid (e.g., poly(acrylic acid)), an amine compound capable of forming an amide and a metal ion complex (e.g., di-2-picolylamine), a thermoresponsive polymer capable of forming an amide with the polyamine and/or polycarboxylic acid, (e.g., poly (N-isopropylacrylamide having a terminal carboxylic acid group)), a solvent, and a catalyst for amide formation (e.g., dimethylformamide (DMF)). Preferably, the solvent forms an azeotrope with water, allowing removal of the water at the boiling point of the azeotrope. The particles formed by this reaction comprise a crosslinked polymer network, which comprises a polyamine portion, a polyacid portion, and thermoresponsive polymer portion, which are covalently linked by amide-containing bridging groups. The polymer network further comprises pendant amine groups and/or polymer backbone amine groups, pendant carboxylic acid groups, and pendant di-2-picolylamide groups.

In a preferred embodiment, the polymer network comprises pendant LCST polymer groups linked to the polycarboxylic acid.

The end groups of the polymer network can comprise any of the foregoing pendant groups, as well as end groups of the initial polyamine, polycarboxylic acid, and LCST polymer materials.

The crosslinking amide groups can be formed by direct reaction of the amine groups of the polyamine with the carboxylic acid groups of the polycarboxylic acid. When the LCST polymer is a polyamide, the crosslinking groups can also be formed by transamidation reactions of the LCST polymer with amine groups of the polyamine and/or carboxylic acid groups of the polycarboxylic acid.

As an example, solid particles prepared with poly(N-isopropylacrylamide) containing a terminal carboxylic acid group as the LCST material were able to strongly bind metal ion and counterion, and release 63% of the bound metal salt upon heating in water.

End Groups

No restriction is placed on polymer chain end groups of the disclosed particles with the proviso that the end groups do not degrade the metal sequestering properties of the particles.

Non-limiting end groups include hydrogen, primary amine groups, $C_1$-$C_{10}$ alkyl or aryl groups, and acylated amine groups (i.e., amide-containing groups).

Alkyl end groups are exemplified by the following chain terminating units of the cationic polyamine:

a) secondary ethylenimine units linked to an alkyl substituent $R^e$, having formula (1):

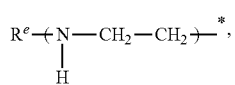
(1)

wherein $R^e$ is a $C_1$-$C_{10}$ alkyl or aryl group, and b) acylated ethylenimine units linked to an alkyl substituent $R^e$, having formula (2):

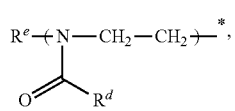
(2)

wherein $R^e$ is a $C_1$-$C_{10}$ alkyl or aryl group, and $R^d$ is a $C_1$-$C_{10}$ alkyl group. In an embodiment, $R^e$ is methyl or ethyl.

Hydroxy end groups are exemplified by the following chain terminating units of linear PEI:

a) protonated secondary ethylenimine units linked to a hydroxy group:

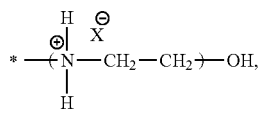

and b) acylated ethylenimine units linked to a hydroxy group:

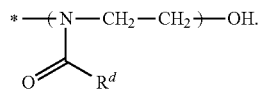

Amino end groups are exemplified by the following chain terminating units of linear PEI:

a) secondary ethylenimine units linked to a protonated primary amine group:

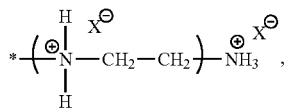

and b) acylated ethylenimine units linked to a protonated primary amine group:

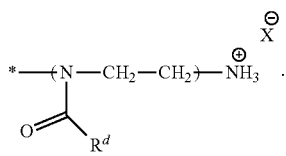

Other end groups include alkoxy, thiol (*—SH), and substituted protonated secondary and tertiary amine groups. Other end groups include derivatives of any of the foregoing groups (e.g., esters and amides of hydroxy and amino end groups, respectively). The disclosed particles can comprise the end groups singularly or in combination.

Metal Ions

The disclosed particles can sequester metal ion salts from aqueous solution. The metal ion can be an ion of a metal selected from the group consisting of lithium, sodium, potassium, rubidium, caesium, francium, beryllium, magnesium, calcium, strontium, barium, radium, aluminum, gallium, indium, thallium, germanium, tin, lead, arsenic, antimony, bismuth, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, lawrencium, rutherfordium, dubnium, seaborgium, bohrium, hassium, meitnerium, darmstadtium, roentgenium, and copernicium.

The disclosed particles can form a metal ion complex containing one or more different metal ions of the above listed metals. A given bound metal ion can have a charge of +1, +2, +3, +4, +5, +6, or +7. More specific metal ions include $Ba^{+2}$, $Ca^{+2}$, $Cr^{+2}$, $Cr^{+3}$, $Cu^{+1}$, $Cu^{+2}$, $Fe^{+2}$, $Fe^{+3}$, $Pb^{+2}$, $Mg^{+2}$, $Mn^{+2}$, $Mn^{+3}$, $Hg^{+2}$, $Ag^{+1}$, $Sr^{+2}$, $Sn^{+2}$, $Sn^{+4}$, $Zn^{+2}$. In an embodiment, the metal ion has a positive charge greater than 1.

The metal ion can be in the form of an oxyanion (e.g., arsenate ($AsO_4^{3-}$), arsenite ($AsO_3^{3-}$), chromate ($CrO_4^{2-}$), dichromate ($Cr_2O_7^{2-}$), permanganate ($MnO_4^{-1}$)) associated with a positive-charged counterion.

The disclosed particles can form a metal ion complex containing one or more metal ions and one or more different counterions.

Counterions

Non-limiting negative-charged counterions include fluoride ($F^-$), chloride ($Cl^-$), bromide ($Br^-$), iodide ($I^-$), nitrate ($NO_3^-$), nitrite ($NO_2^-$), sulfate ($SO_4^{-2}$), hydrogen sulfate ($HSO_4^-$), thiosulfate ($S_2O_3^{-2}$), sulfite ($SO_3^{-2}$), perchlorate ($ClO_4^-$), chlorate ($ClO_3^-$), chlorite ($ClO_2^-$), hypochlorite ($OCl^-$), carbonate ($CO_3^{-2}$), hydrogen carbonate ($HCO_3^-$) or bicarbonate, acetate ($CH_3COO^-$), cyanide ($CN^-$), cyanate ($OCN^-$), thiocyanate ($SCN^-$), and hydroxide ($OH^-$).

Non-limiting positive-charged counterions include ammonium ($NH_4^+$), protonated primary, secondary and tertiary amines, quaternary ammonium ions, hydrogen ($H^+$), hydronium ($H_3O^+$), lithium ion ($Li^+$), nitronium ($NO_2^+$), potassium ion ($K^+$), and sodium ion ($Na^+$).

Sub-Structural Units of the Particles

The disclosed particles can comprise at least one non-charged N-acylated ethylenimine unit of formula (3):

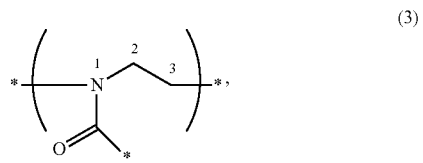

(3)

wherein the carbonyl group is a portion of a crosslinking group joining polymer chains or is a portion of a pendant group.

Likewise, the disclosed particles can comprise at least one ethylene unit of formula (4):

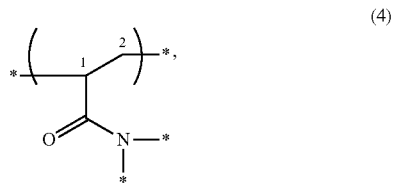

(4)

wherein the amide group is a portion of a crosslinking group linking polymer chains, or is a portion of an end group.

The disclosed particles can further comprise one or more oxidized ethylenimine units of formula (5):

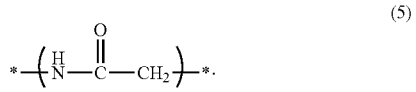

(5)

The disclosed particles can be effective metal ion sequestering agents without having a backbone nitrogen in the form of a quaternary ammonium salt. Herein, a quaternary ammonium salt comprises a positive-charged nitrogen that is covalently linked only to carbons (e.g., 4 carbons) and is non-covalently associated with a negative-charged counterion. The positive charged nitrogen of a quaternary ammonium salt is not covalently bound to any hydrogen. In an embodiment, the polyamine structure excludes any backbone nitrogen in the form of quaternary ammonium salt.

Polyamines

Herein, a polyamine is a general term used to mean a polymer comprising at least one polymer branch, the polymer branch comprising a repeat unit comprising an amine group selected from the group consisting of primary amine groups, secondary amine groups, tertiary amine groups, and combinations thereof. The nitrogen of the amine group of a given repeat unit can be located in the polymer backbone and/or in a sidechain pendant to the backbone. Preferably, the end groups of the polyamine comprise a primary amine group and/or secondary amine group. Non-limiting examples of polyamines include gelatin, poly(aniline), poly(lysine), poly(vinyl amine), poly(allyl amine), and poly(ethylenimine).

Preferably, the polyamine is a poly(ethylenimine) (PEI), and more preferably a branched PEI. A PEI comprises a backbone comprising a plurality of repeat units referred to herein as ethylenimine units. Each of the ethylenimine units has 1 backbone nitrogen and 2 backbone carbons arranged as in formula (6).

(6)

It should be understood that the nitrogen labeled 1 is trivalent and each carbon is tetravalent. Other substituents on the carbons and nitrogen are not shown in the above structure. The nitrogen labeled 1 represents the head of a given ethylenimine unit, and the carbon labeled 3 represents the tail of a given ethylenimine unit. In a PEI, adjacent ethylenimine units are covalently linked in a head-to-tail arrangement (i.e., nitrogen 1 of a given ethylenimine unit can be linked to carbon 3 of an adjacent ethylenimine unit or a polymer chain end group, and carbon 3 can be linked to a nitrogen 1 of an adjacent ethylenimine unit or a polymer end group).

The PEI can comprise one or more polymer branches. A linear PEI comprises i) one branch comprising a plurality of ethylenimine units and ii) two polymer chain end groups (also referred to herein as peripheral end groups, or dangling end groups). A branched PEI comprises two or more intersecting branches comprising ethylenimine units and three or more peripheral end groups. The branches intersect at tertiary nitrogens of the ethylenimine units.

Structures (A) and (B) below illustrate the alternating arrangement of backbone carbon pairs and backbone nitrogens of the ethylenimine units of a linear PEI and branched PEI having two branches. The *—C—C—N—* unit enclosed in parentheses represents an ethylenimine unit. End groups, charges, counterions and substituents of the backbone carbons and nitrogens are not shown.

Linear PEI (A)

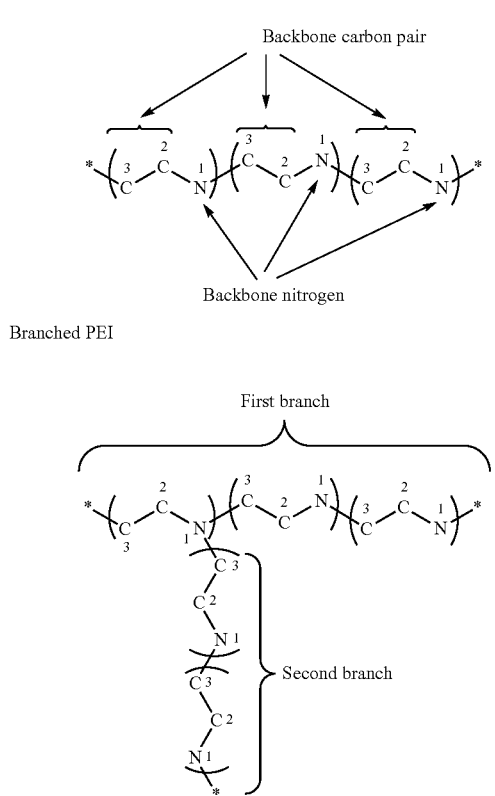

Branched PEI (B)

As shown above, adjacent *—C—C—N—* units are linked in a head-to-tail arrangement.

The primary, secondary, and tertiary amine nitrogens of a PEI can be present as ammonium salts of a protic acid (i.e., primary ammonium salt, secondary ammonium salt, or tertiary ammonium salt). A primary ammonium salt comprises a positive-charged nitrogen covalently linked to 1 carbon and 3 hydrogens, and non-covalently associated with a negative-charged counterion. A secondary ammonium salt comprises a positive-charged nitrogen covalently linked to 2 carbons and 2 hydrogens, and non-covalently associated with a negative-charged counterion. A tertiary ammonium salt comprises a positive-charged nitrogen covalently linked to 3 carbons and 1 hydrogen, and non-covalently associated with a negative-charged counterion.

Thus, a given PEI can comprise a plurality of ethylenimine units independently selected from the group consisting of:

i) protonated primary ethylenimine units of formula (7):

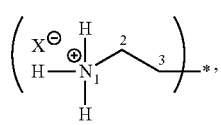

(7)

ii) non-protonated primary ethylenimine units of formula (8):

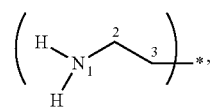

(8)

iii) protonated secondary ethylenimine units of formula (9):

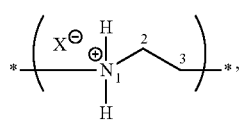

(9)

wherein the asterisk linked to the nitrogen represents a carbon, iv) non-protonated secondary ethylenimine units of formula (10):

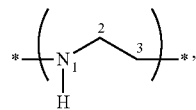

(10)

wherein the asterisk linked to the nitrogen represents a carbon, v) protonated tertiary ethylenimine units of formula (11):

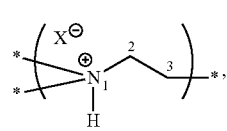

(11)

wherein each of the asterisks linked to the nitrogen represent different carbons, and vi) non-protonated tertiary ethylenimine units of formula (12):

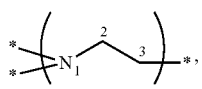

(12)

wherein each of the asterisks linked to the nitrogen represent different carbons. More than 0% of the ethylenimine units are present in protonated form. More specifically, about 55% of the backbone amine groups can be protonated in aqueous solution under physiological conditions.

In each of the above structures $X^\ominus$ is a negative-charged counterion bound by non-covalent interactions with the positive-charged nitrogen labeled 1. Exemplary negative-charged counterions include halides (e.g., fluoride, chloride, bromide, iodide), hydroxide, nitrate, methane sulfonate, and carboxylates (e.g., acetate, benzoate). In an embodiment, $X^\ominus$ is hydroxide. The polyamine can comprise $X^\ominus$ groups singularly or in combination.

A branched PEI is represented herein by formula (13):

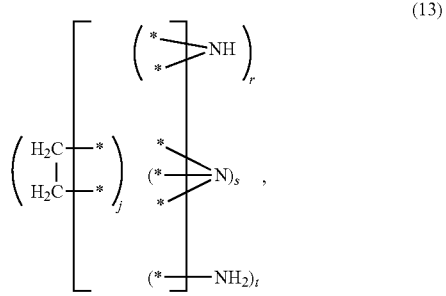

wherein j, r, s, and t represent average numbers of the respective independent functional groups of a BPEI macromolecule. Subscript j has an average value greater than or equal to 4, and r+s+t has an average value greater than or equal to 4. It should be understood by the notation of formula (13) that each set of parentheses ( ) beginning inside the square brackets [ ] and ending outside the square brackets encloses an independent functional group of the BPEI, not a polymer chain. Additionally, the atoms having bonds to asterisks on one square bracket are linked to atoms on the opposite bracket, with above-described restrictions on head-to-tail arrangements of the ethylenimine units. That is, each bond to an asterisk of a given nitrogen on the right square bracket is linked to a different ethylene group on the left square bracket (or an end group), and each bond to an asterisk of an ethylene group on the left square bracket is linked to a different nitrogen on the right square bracket (or to an end group), consistent with the head to tail arrangement of adjacent ethylenimine units. Additionally, the vertical stacking of the functional groups indicates a random distribution of the stacked functional groups in the branched PEI.

In an embodiment, j has an average value of about 180 to about 360, r has an average value of about 90 to about 140, s has an average value of about 45 to about 70, t has an average value of about 45 to about 70, and (r+s+t) has an average value of about 180 to about 360. In another embodiment, the branched polyethylenimine has a weight average molecular weight (Mw) greater than 1000.

As an example, a commercially available branched polyethylenimine has a weight average molecular weight (Mw) of about 25,000, a number average molecular weight (Mn) of about 10,000, and contains an average of 233 ethylene groups (j), 116 backbone secondary nitrogens (r), 58 backbone tertiary nitrogens (s), and 58 primary amine nitrogens (t), based on Mn and an average ethylenimine unit molecular weight equal to 43. In this instance, j=233, r=116, s=58, and t=58. This material is referred to herein as BPEI25.

As another example, a commercially available branched polyethylenimine has a weight average molecular weight (Mw) of about 2000, a number average molecular weight (Mn) of about 1800, and contains an average of 40 ethylene groups (j), 20 backbone secondary nitrogens (r), 10 backbone tertiary nitrogens (s), and 10 primary amine nitrogens (t), based on Mn and an average ethylenimine unit molecular weight equal to 43. In this instance, j=40, r=20, s=10, and t=10. This material is referred to herein as BPEI1.8.

The BPEI used to form the disclosed particles can have a number average molecular weight (Mn) of about 1000 to about 75,000.

Protonated and non-protonated tertiary ethylenimine units serve as junction points for intersecting branches of a branched PEI. Protonated and non-protonated primary ethylenimine units serve as branch terminating units. Herein, a hydrogen linked to a nitrogen of a primary ethylenimine unit can be a polymer chain end group. The PEI can have other polymer chain end groups (e.g., hydrogen, alkyl groups, amine groups, hydroxyalkyl groups, and combinations thereof).

The PEI (linear or branched) can comprise about 100 to about 400 ethylenimine units, more preferably about 100 to about 300 ethylenimine units. The end groups of the polyamine can be any suitable end groups for the intended purpose of the disclosed particles.

The polyamines can have a number average molecular weight (Mn) of about 500 to about 100000, more particularly about 1500 to about 60000, and most particularly about 5000 to about 60000.

Polyacids

The polyacid is preferably a polycarboxylic acid (e.g., poly(acrylic acid), poly(methacrylic acid), poly(4-vinylbenzoic acid), poly(itaconic acid), poly(aspartic acid) poly (glutamic acid), copolymers of any of the foregoing, combinations of any of the foregoing, and the like). The carboxylic acid groups of the polycarboxylic acid can be present as non-ionized COOH groups or a salt of a carboxylic acid group (e.g., ammonium salt, sodium salt, lithium salt, potassium salt). The salts can be present singularly or in combination.

Amino Acids

Non-limiting exemplary amino acids include stereospecific or non-stereospecific forms of alanine, arginine, asparagine, aspartic acid, cysteine, glutamine, glutamic acid, histidine, isoleucine, leucine, lysine, methionine, phenylalanine, proline, serine, threonine, tryptophan, tyrosine, and valine. Other amino acids have a structure according to formula (14):

where m is a positive whole number having a value of 1-20. The amino acids can be used singularly or in combination. In an embodiment, the amino acid is glycine (m=1).

Thermoresponsive Polymers

The thermoresponsive polymer has a critical solution temperature in water between 30° C. and 100° C. The thermoresponsive polymer can possess a lower critical solution temperature (LCST) and/or an upper critical solution temperature properties (UCST) in an aqueous solution. In general, the concentration of the thermoresponsive polymer can be in a range between 0 wt % and 25 wt % based on total weight of the aqueous solution, more specifically about 1 wt % to about 10 wt %, and even more specifically 1 wt % to 5 wt %.

Lower critical solution temperature (LCST) properties are characterized by a temperature (LCST) between 30° C. and 100° C. below which all concentrations of the thermoresponsive polymer in aqueous solution are miscible with water compared to temperatures above the LCST. Upper critical solution temperature (LCST) properties are characterized by a temperature (UCST) between 30° C. and 100° C. above which a given concentration of the thermoresponsive polymer in aqueous solution is more miscible with water compared to temperatures below the UCST. The LCST and USCT Preferably, the thermoresponsive polymer has a LCST between 30° C. and 100° C. (e.g., poly(N-isopropylacrylamide). At the LCST the structure of the water of hydration in the hydrophilic regions of the swollen particle collapses in favor of non-covalent hydrophobic interactions of the polymer structure. Visually, this can lead to an increase in cloudiness of an aqueous mixture of the polymer when heated above the LCST. The metal ion binding properties can also decrease above the LCST, allowing release of bound metal ion(s) and their counterions. Typically, the LCST properties are reversible (i.e., cooling the aqueous mixture restores the water of hydration and the metal ion binding properties of the particles).

Non-limiting thermoresponsive polymers in water include N-monosubstituted and N-disubstituted poly(acrylamide)s and poly(methacrylamide)s such as, for example, poly(N-ethylacrylamide), poly(N-ethylmethacrylamide), poly(N-isopropylacrylamide), poly(N,N-ethylmethylacrylamide), poly(N-n-propylacrylamide), poly(N-n-propylmethacrylamide), poly(N-isopropylacrylamide), poly(N-isopropylmethacrylamide), poly(N-cyclopropylacrylamide), poly(N-(L)-(1-hydroxymethyl)propylmethacrylamide), poly(N-acryloylpyrrolidine), and poly(N-acryloylpiperidine).

Other thermoresponsive polymers in water include poly(N-vinyl propylacetamide), poly(N-vinyl-5-methyl-2-oxazolidone), poly(L-proline), poly(N-acryloyl-L-proline methyl ester), poly(N-acryloyl-4-trans-hydroxy-L-proline methyl ester), poly(methyl 2-propionamidoacrylate), poly(N-vinyl isobutyramide), hydroxypropylcellulose, poly(N-vinylcaprolactam), polyvinyl methyl ether, and poly[2-(dimethylamino)ethyl methacrylate].

The thermoresponsive polymer comprises a reactive functional group (e.g., carboxylic acid group, active ester group, primary amine group, secondary amine group) capable of forming an amide group in the reaction used to prepare the disclosed particles. Preferably, the reactive functional group is present in an end group of the thermoresponsive polymer. Preferred thermoresponsive polymers include carboxylic acid terminated poly(N-isopropylacrylamide) (15), amine terminated poly(N-isopropylacrylamide) (16), and N-hydroxysuccinimide ester terminated poly(N-isopropylacrylamide) (17):

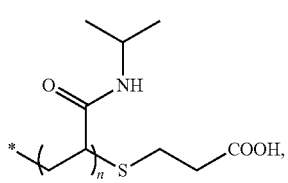

(15)

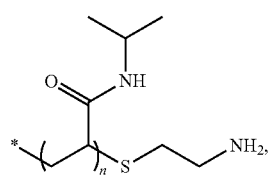

(16)

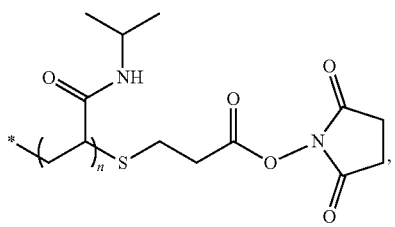

(17)

where n has an average value in the range of about 15 to about 100. The thermoresponsive polymer preferably has a number average molecular weight Mn of about 1500 to about 15000.

Solvents

Preferred solvents for the reaction mixture are aromatic and non-aromatic hydrocarbons capable of forming an azeotrope with water released by the amide-forming reaction (e.g., n-heptane, n-hexane, benzene, toluene, and xylene). An especially preferred solvent is toluene.

Catalyst

The preferred catalyst for the formation of the disclosed particles is an organic catalyst comprising no metal, more particularly an N,N-disubstituted formamide (e.g., N,N-dimethylformamide, N,N-diethylformamide, N,N'-methylethylformamide). An especially preferred catalyst is N,N-dimethylformamide. The catalyst is used in an amount 2 mol % to 15 mol % of the total moles of carboxylic acid groups of the initial reaction mixture.

The following examples illustrate the formation and use of the disclosed particles.

EXAMPLES

Materials used in the following examples are listed in Table 1.

TABLE 1

| ABBREVIATION | DESCRIPTION | VENDOR |
| --- | --- | --- |
| BPEI | Branched poly(ethyleneimine), Mw = 25000, Mn = 10000 | Sigma Aldrich. |
| PAA | Poly(acrylic acid), Mw = 1800 | Sigma Aldrich. |
| | Glycine, Mw 75.07 | Sigma Aldrich. |
| | Di-(2-picolylamine), MW = 199.25 | Sigma Aldrich, Tokyo Chemical International (TCI). |
| Ca(OTf)$_2$ | Calcium trifluoromethanesulfonate | Sigma Aldrich. |
| PNIPA | Poly(N-isopropylacrylamide) | Sigma Aldrich. |

Herein, Mn is the number average molecular weight, Mw is the weight average molecular weight, and MW is the molecular weight of one molecule.

The functionalized solid particles were designed with three primary components: (i) a hydrophilic reactive branched polymer that could be readily crosslinked and allow metal binding ligands to be introduced (ii) crosslinking chemistry that introduces a component to modulate the glass transition temperature of the particle and will not require significant chemical reagents in the cross-linking reaction and (iii) metal binding ligands that can be loaded at a high mole % (or wt %) to provide a large number of sites for metal ion attachment. With respect to (i), branched poly(ethylenimine) acts as the backbone to the particle as it is readily available and provides an electron rich set of amine groups for rapid reactivity. With respect to (ii), active carboxylic acid groups of poly(acrylic acid) form crosslinking amide bonds with the branched poly(ethylenimine). Poly(acrylic acid) can also be used to modulate the hydrophobicity to tailor the degree of swelling. Furthermore, the particle can be modified with poly(methylacrylic acid) instead of PAA to increase hydrophobicity and glass transition state. For regeneration and lower critical solution temperature (LCST) manipulation, poly(N-isopropylacrylamide) can be introduced to manipulate particle aggregation in water and recyclability. Poly(N-isopropylacrylamide) also was found to increases pore size of the particle. With respect to (iii), both glycine and di-2-picolylamine provide for metal chelating as they introduce N-donor sites that bind to different metal ions in water solution.

Example 1. Synthesis of Functionalized Solid Particle FSP-1

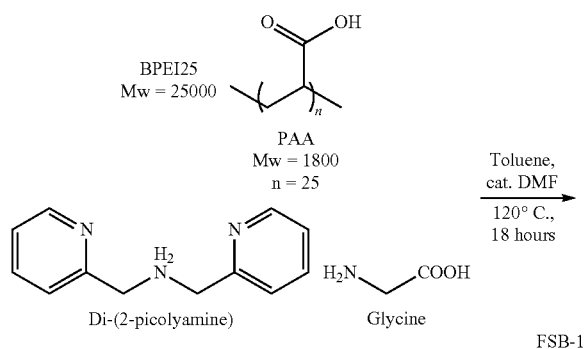

Branched poly(ethyleneimine) (BPEI25, 2 g, Mn=10000, Mw=25000, 16 mmol reactive primary amine), poly(acrylic acid) (PAA, 2 g, Mw=1800, 27.8 mmol carboxylic acid), glycine (1 g, 13 mmol, MW 75.07), and di-(2-picolylamine) (1 g, 5 mmol, MW 199.25) mixed and combined with a catalytic amount of DMF (5 mL) in 50 mL toluene in 250 mL round bottom flask equipped with a Dean-Stark trap and mechanical stir bar. The mixture was heated to 120° C. and stirred at 60 rph (revolutions per hour) under a constant flow of $N_2$ gas for 18 hours. The Dean-Stark was filled with toluene to remove water overnight. The trap was then emptied to allow the remaining toluene to evaporate over 5 hours. The crude product in DMF was then poured in boiling water and magnetically stirred for 2 hours to remove DMF. The product was isolated under vacuum and dried in a vacuum oven at 100° C. The functionalized solid particles were ground and sonicated in dichloromethane to yield a pure light brown crosslinked functionalized particle, FSP-1 (3.4 g).

FIG. 1 is a $^1$H NMR spectrum of FSP-1 in $D_2O$ containing residual toluene and DMF solvent. The broad peaks corresponding to BPEI25 at δ 2.5 ppm shifted to δ 2.8 ppm in FSP-1. The NMR contained broad poly(acrylic acid) peaks at δ 1.2-2.0 ppm, low intensity aromatic peaks of dipicolylamine at 7 ppm and 8.3 ppm, and a glycine peak at 3.4 ppm.

Figure 2:
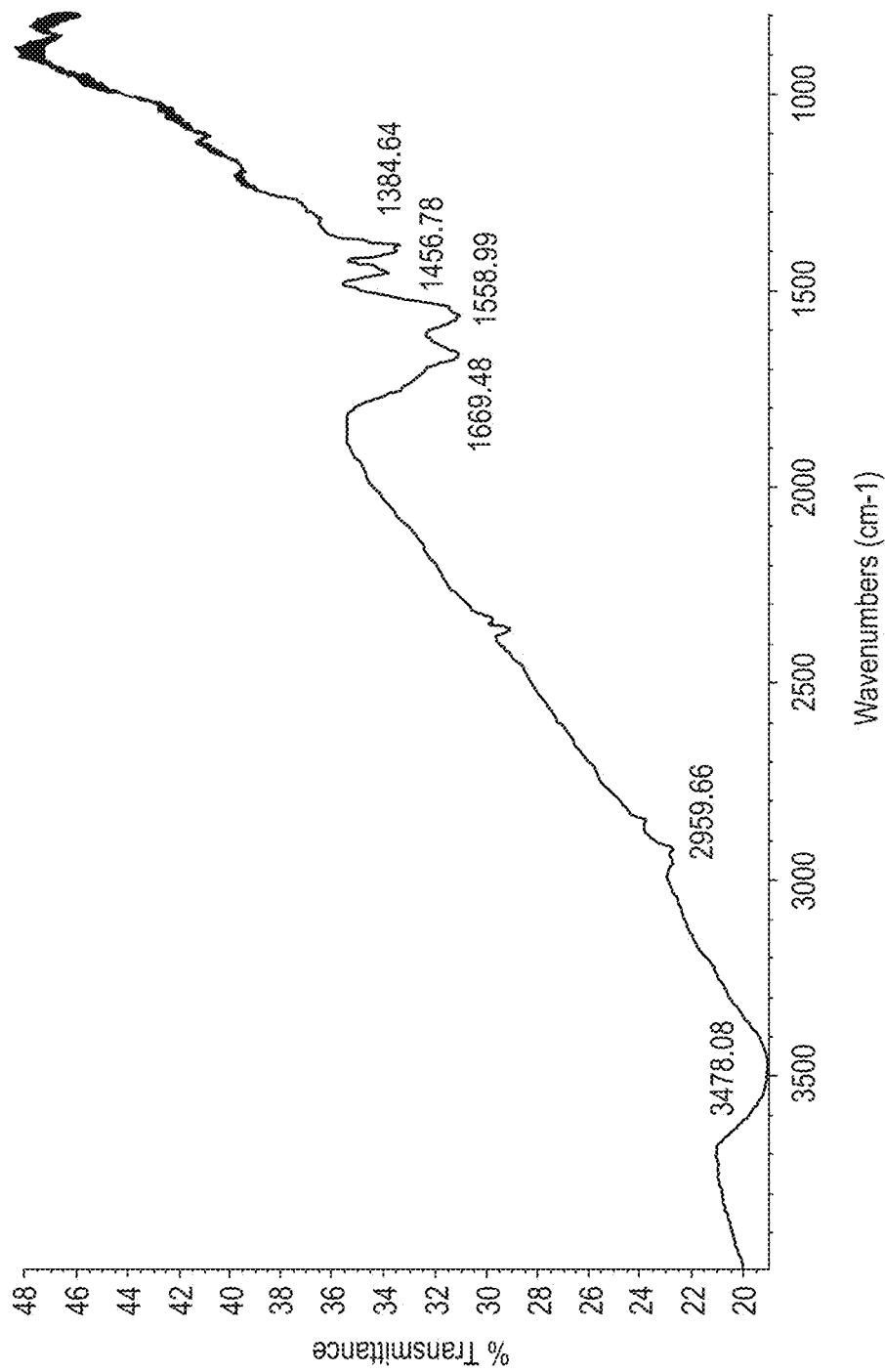
FIG. 2 is a Fourier-transform infrared (FT-IR) spectrum of FSP-1 (KBr pellet).

FIG. 2 is an FT-IR spectrum of FSP-1 (KBr pellet).

Figure 3:
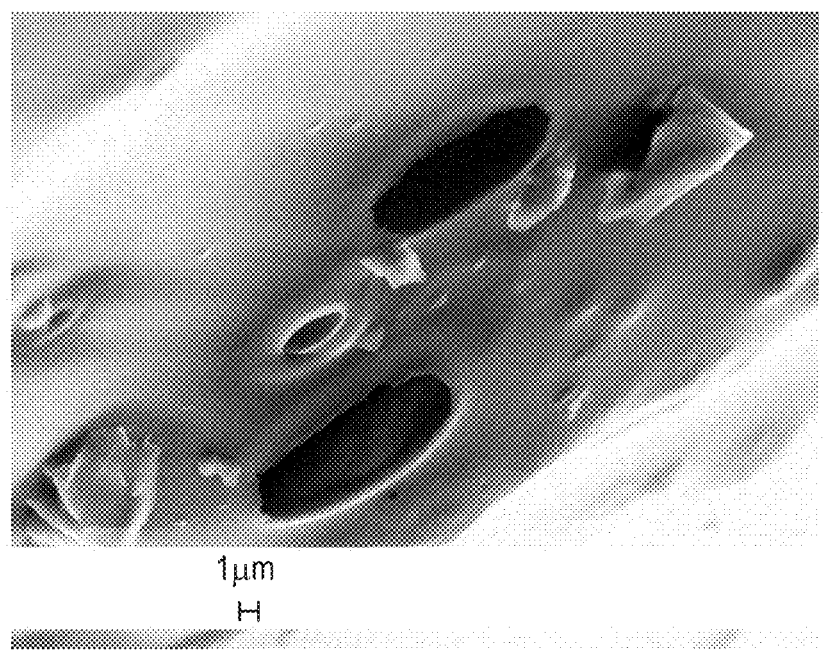
FIG. 3 is an SEM micrograph of FSP-1, showing a pore size of about 11.7 micrometers.

FIG. 3 is an SEM micrograph of FSP-1, showing a pore size of about 11.7 micrometers.

Figure 4:
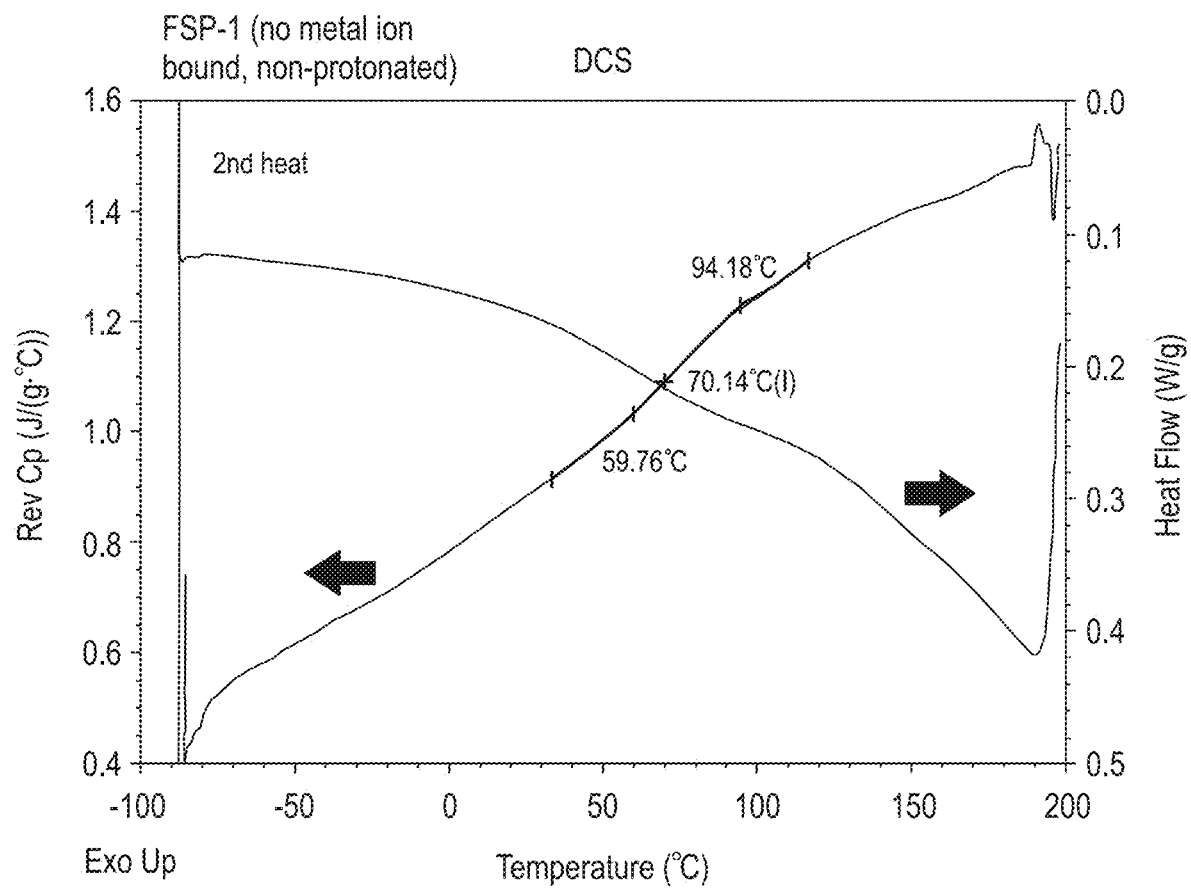
FIG. 4 is a plot of the differential scanning calorimetry (DSC) curves obtained for FSP-1 containing no bound metal ion and before protonation. The glass transition temperature (Tg) obtained was about 70° C.

FIG. 4 is a plot of the differential scanning calorimetry (DSC) curves obtained for FSP-1 containing no bound metal ion and before protonation (see following). The glass transition temperature (Tg) obtained was about 70° C.

Figure 5:
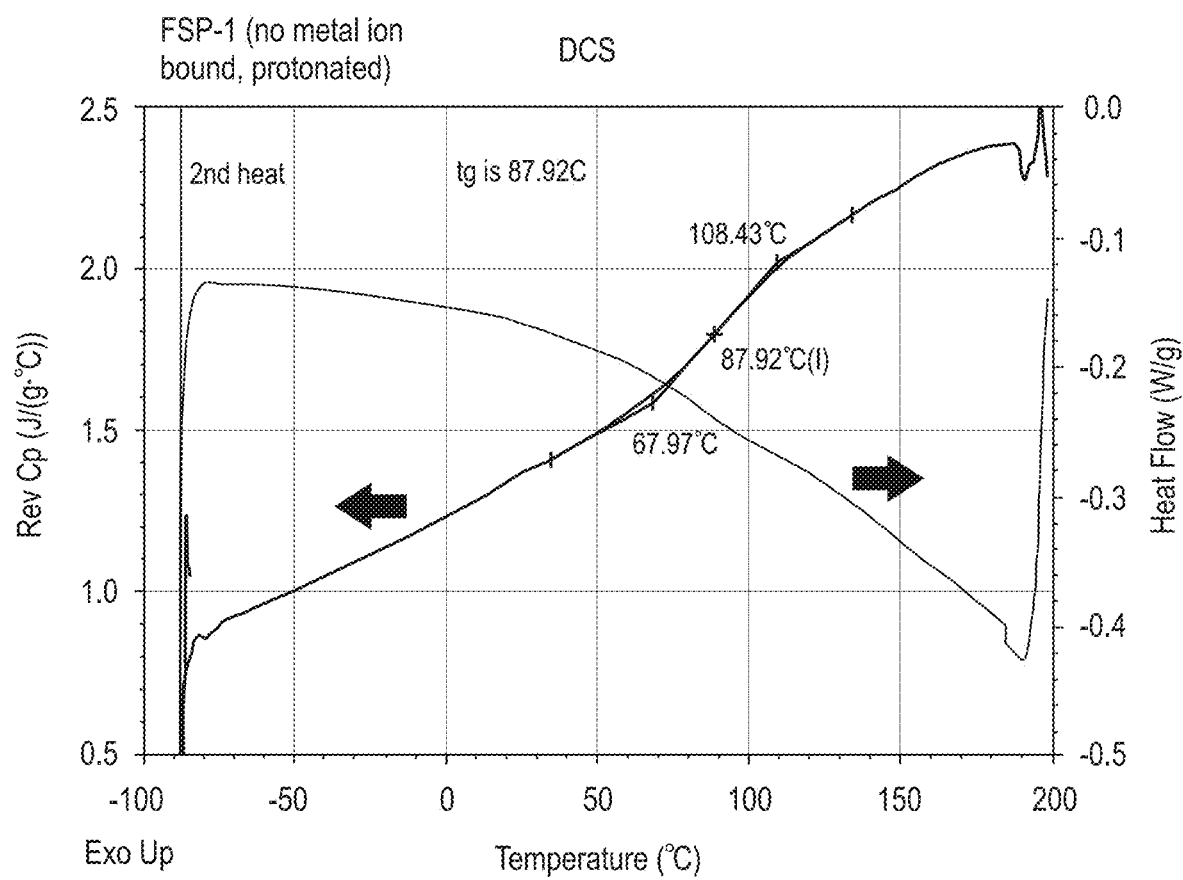
FIG. 5 is a plot of the DSC curves obtained for FSP-1 after protonation and containing no bound metal ion. The glass transition temperature (Tg) obtained was about 87° C.

FSP-1 was protonated by addition of HCl to the water swollen particles followed by filtration and lyophilization. FIG. 5 is a plot of the DSC curves obtained for FSP-1 after protonation containing no bound metal ion. The glass transition temperature (Tg) obtained was about 87° C.

Example 2. Synthesis of Functionalized Solid Particle FSP-2

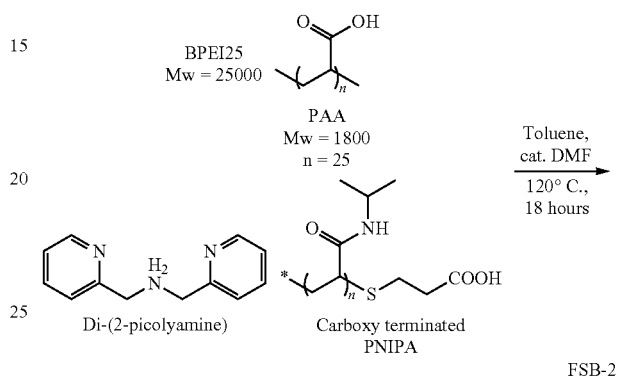

Branched poly(ethyleneimine) (4 g, 39 mmol reactive amine), poly(acrylic acid) (5 g, 50 mmol carboxylic acid), di-2-picolylamine (500 mg, 2.5 mmol), and poly(N-isopropylacrylamide) having a terminal carboxylic acid group (200 mg, 0.03 mmol) mixed and combined with catalytic DMF(1 mL) in 50 mL toluene in 250 mL round bottom flask equipped with a Dean-Stark trap and mechanical stir bar. The mixture was heated to 120° C. and stirred at 60 rph under a constant flow of $N_2$ gas for 18 hours. The Dean-Stark was filled with toluene to eliminate water overnight. The trap was then emptied to allow the toluene to evaporate from the remaining solution over 5 hours. The crude product in DMF was then poured in boiling water and magnetically stirred for 2 hours to remove DMF. The product was isolated under vacuum and dried in a vacuum oven at 100° C. The solid product was ground and sonicated in dichloromethane to yield pure off-white crosslinked functionalized particles, FSP-2 (2.6 g).

Figure 6:
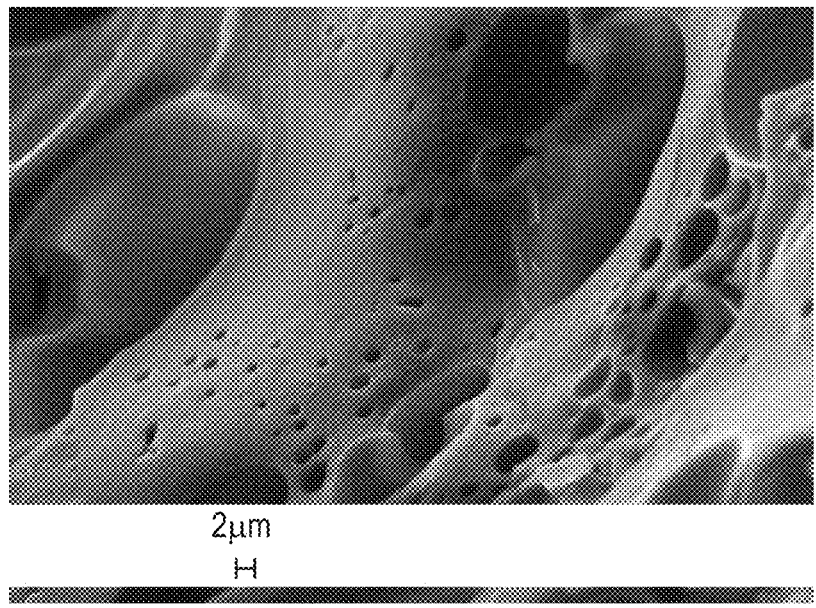
FIG. 6 is an SEM micrograph of FSP-2, showing a pore size of about 22 micrometers.

FIG. 6 is an SEM micrograph of FSP-2, showing a pore size of about 22 micrometers.

Example 3 (Comparative)

Synthesis of Linear Analog Polymer FSP-3. Poly(acrylic acid) (3.0 g, 29 mmol carboxylic acid groups), and di-2-picolylamine (2.9 g, 14.7 mmol) were combined with a catalytic amount of DMF (1 mL) in 20 mL toluene in 250 mL round bottom flask equipped with Dean-Stark trap and mechanical stir bar. The mixture was heated to 110° C. and stirred at 60 rph under a constant flow of $N_2$ gas for 18 hours. The Dean-Stark was filled with toluene to eliminate water overnight. The trap was then emptied to allow the toluene to evaporate from solution over 5 hours. The crude product in DMF was then poured in boiling water and magnetically stirred for 18 hours to remove DMF. The product was then isolated under vacuum and dried in vacuum oven at 100° C.

The solid product was sonicated in dichloromethane to yield a pure functionalized PAA-dipicolylamine functionalized polymer, FSP-3 (4.2 g).

Binding Studies

Example 4

Crosslinked protonated FSP-1 (33 mg) was combined with $H_2O$ (5 mL) containing $Ca(OTf)_2$ (112 mg) and the resulting mixture was stirred for 20 minutes. The solid was isolated by centrifugation and was lyophilized for 18 hours to yield metal-bound particle (120 mg) containing 75 mg metal ion (2.3 times the particle weight).

Figures 7A, 7B:
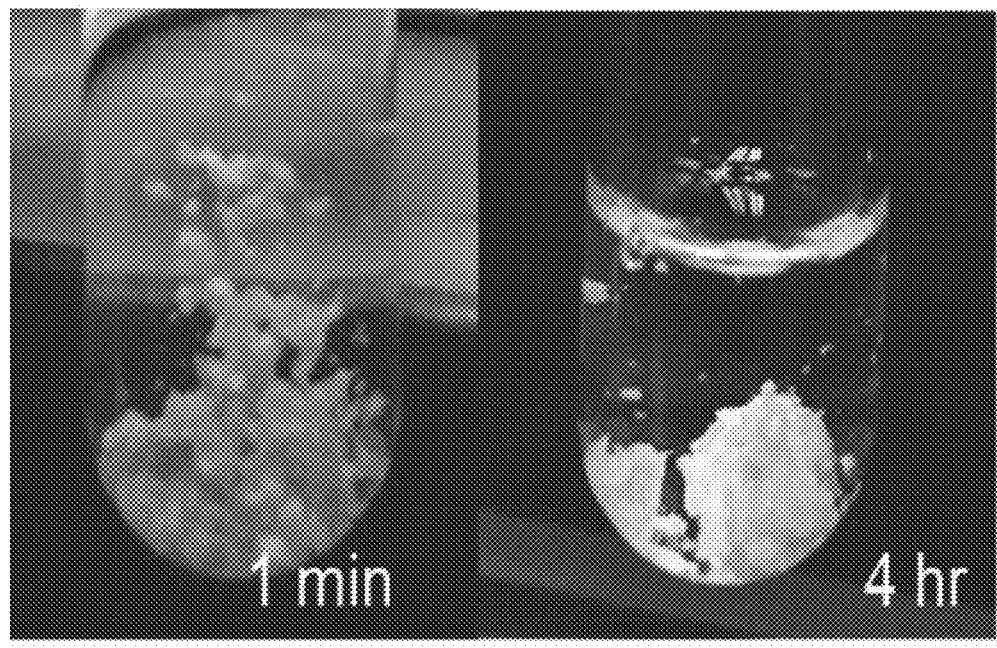
FIGS. 7A-7B are photographs of swollen FSP-1 after 1 minute and 4 hours, respectively, in water.

FIGS. 7A-7B are photographs of swollen FSP-1 after 1 minute and 4 hours, respectively, in water.

Figure 8:
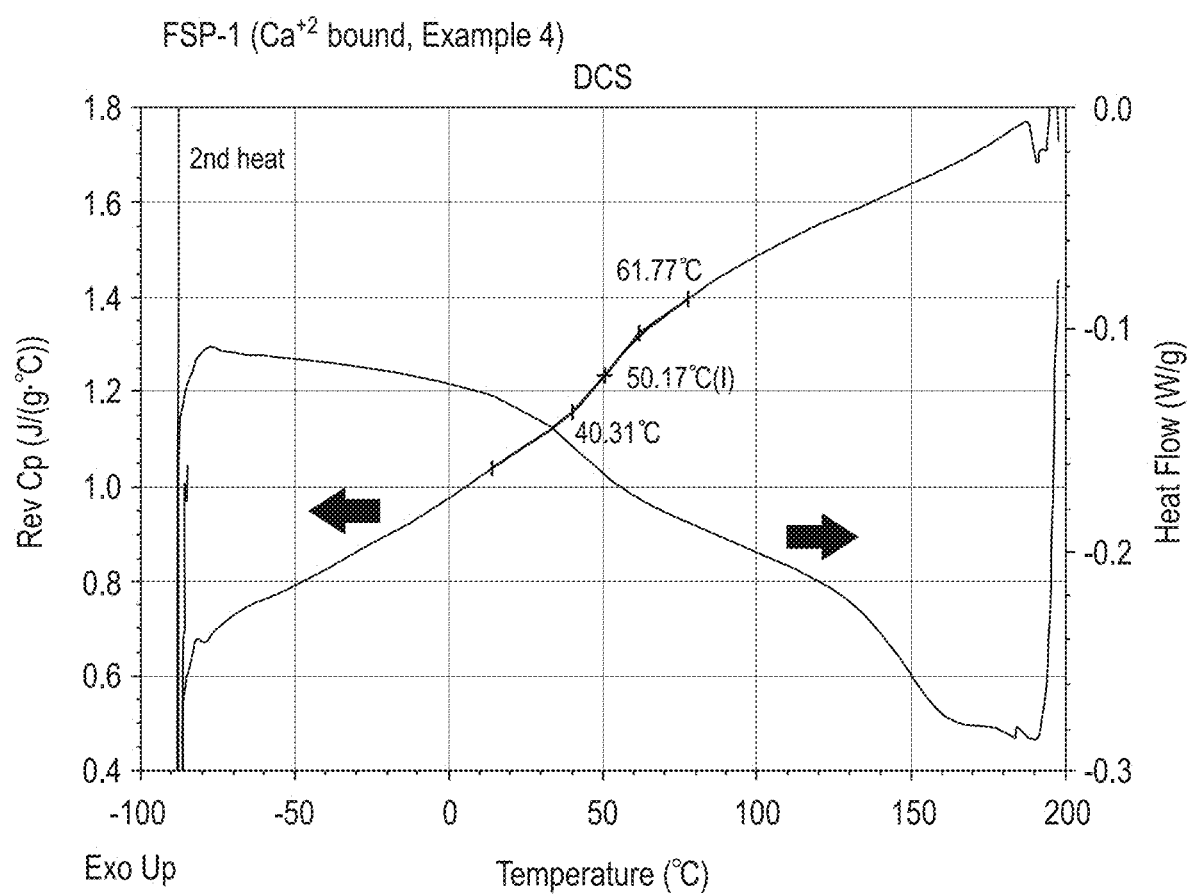
FIG. 8 is a plot of the DSC curves obtained for protonated FSP-1 bound to $Ca^{+2}$. The Tg obtained was about 50° C.

FIG. 8 is a plot of the DSC curves obtained for protonated FSP-1 bound to $Ca^{+2}$. The Tg obtained was about 50° C.

Example 5

Crosslinked protonated particle FSP-2 (300 mg) was combined with $H_2O$ (25 mL) containing $Ca(OTf)_2$ (1 g) and the resulting mixture was stirred for 18 hours. The solid was isolated by centrifuge and lyophilized for 18 hours to yield metal-bound particle (1.3 g) containing 945 mg bound metal ion (3.1 times particle weight).

Example 6

The product of Example 5 (213 mg) was re-swollen in distilled water and stirred at 100° C. for 2 hours. The solid was isolated by centrifuge and lyophilized for 18 hours to yield solid (29 mg) and calcium triflate (36 mg) in water solution (55 wt % of metal bound).

Column Chromatography Processes

Example 7

Each of 5 syringes (10 mL) equipped with a filter tip was packed with water-swollen FSP-1 (500 mg, swollen 3 hours in distilled water). $Ca(OTf)_2$ (1 g) was dissolved in $D_2O$ (10 mL) and then added to the first prepared column (syringe 1). The filtrate was collected and an NMR was obtained on a sample of the filtrate (500 µL) using trifluoroethanol (10 µL) as an internal standard. The filtrate was then added to a second syringe and the processed repeated for each of the 5 syringes.

Figure 9:
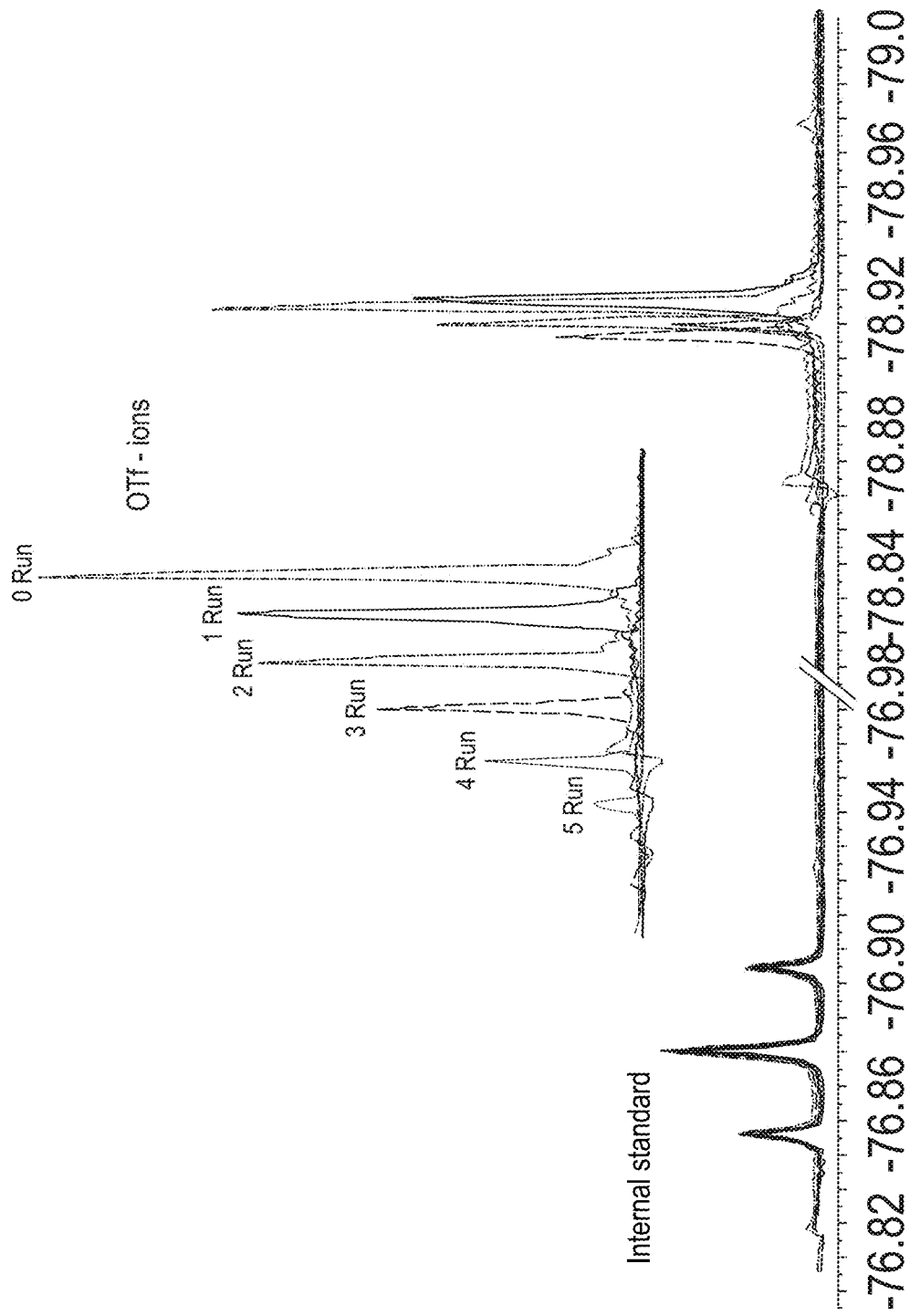
FIG. 9 is a set of overlapping $^{19}F$ NMR spectra of the collected filtrates from Example 7, showing the decrease in triflate ($OTf^{-1}$) concentration with each pass through a syringe column. The inset peaks were offset for clarity.

FIG. 9 is a set of overlapping $^{19}F$ NMR spectra acquired at 300 MHz, 298 K, in $D_2O$ of the collected filtrates from Example 7, showing the decrease in OTf concentration with each pass through a syringe column. The inset peaks were offset for clarity. The decrease in OTf concentration indicates the calcium ion was also bound to FSP-1.

Figure 10:
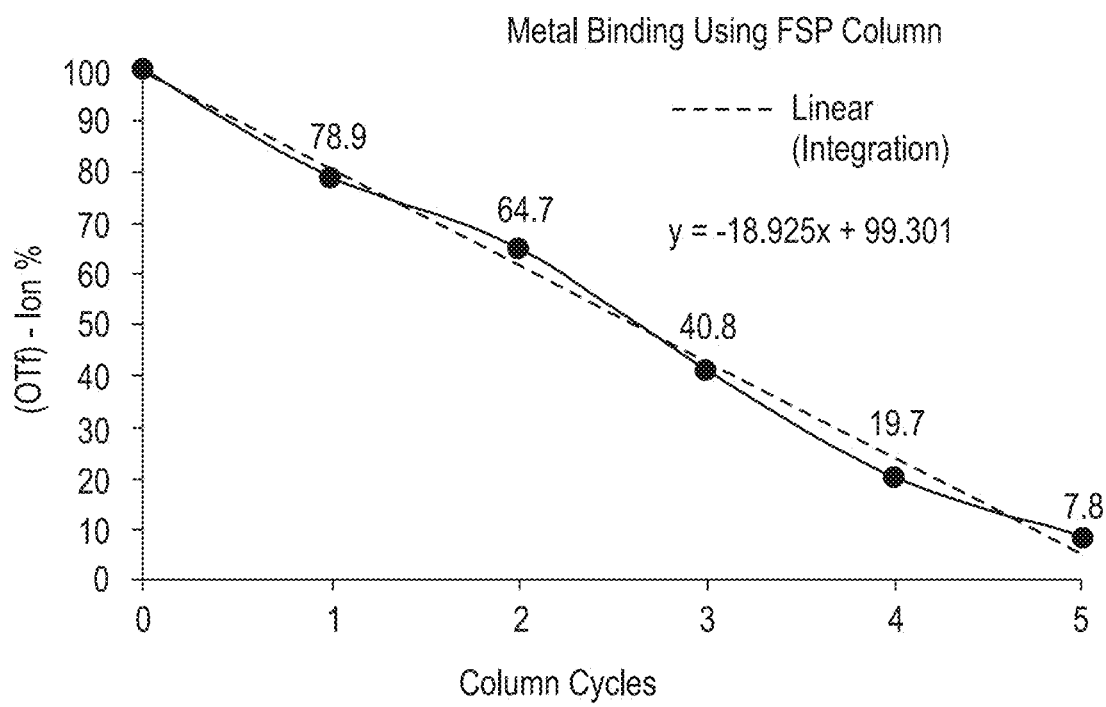
FIG. 10 is a graph showing the areas under the inset peaks of FIG. 9.

FIG. 10 is a graph showing the areas under the inset peaks of FIG. 9. The dotted line is a linear regression of the labeled points.

Low Concentration Column Chromatography Processes

Example 8

Each of 5 syringes (5 mL) equipped with a filter tip was packed with water-swollen non-protonated FSP-1 (500 mg, swollen 3 hours in distilled water). $Ca(OTf)_2$ (80 mg) was dissolved in $D_2O$ (10 mL). The resulting solution was added to the first prepared column (syringe 1). The filtrate was collected and an NMR was obtained on a sample of the filtrate (500 µL) in trifluoroethanol (5 µL). The filtrate was then added to a second syringe and the processed repeated for each of the 5 syringes.

Figure 11:
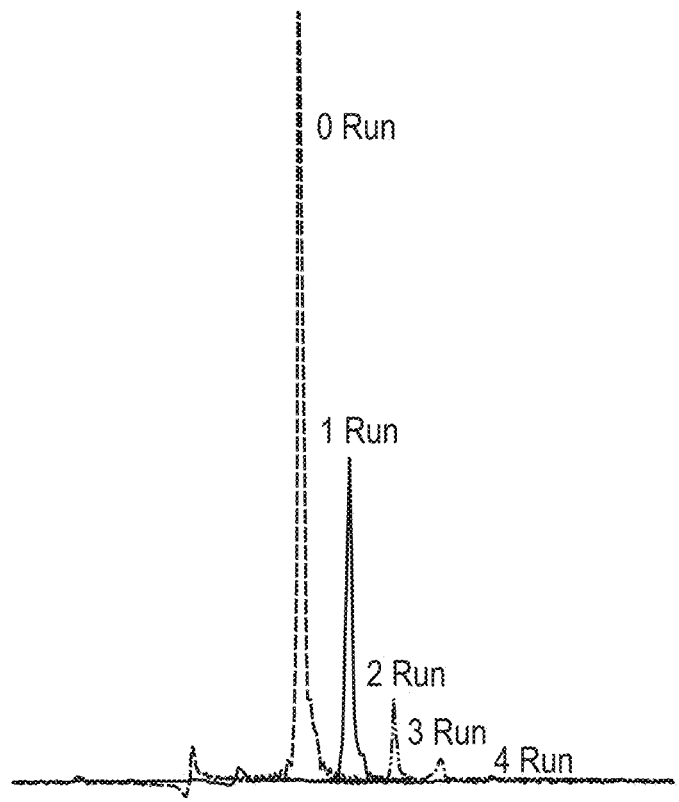
FIG. 11 is a set of overlapping $^{19}F$ NMR spectra (acquired at 300 MHz, 298 K, in $D_2O$) of the collected filtrates from Example 8, showing the decrease in $OTf^-$ concentration with each pass through a syringe column. The inset peaks were offset for clarity from $\delta$ −78.9 to −79.0 ppm.

FIG. 11 is a set of overlapping $^{19}F$ NMR spectra acquired at 300 MHz, 298 K, in $D_2O$ of the collected filtrates from Example 8, showing the decrease in OTf concentration with each pass through a syringe column. The peaks were offset for clarity.

Figure 12:
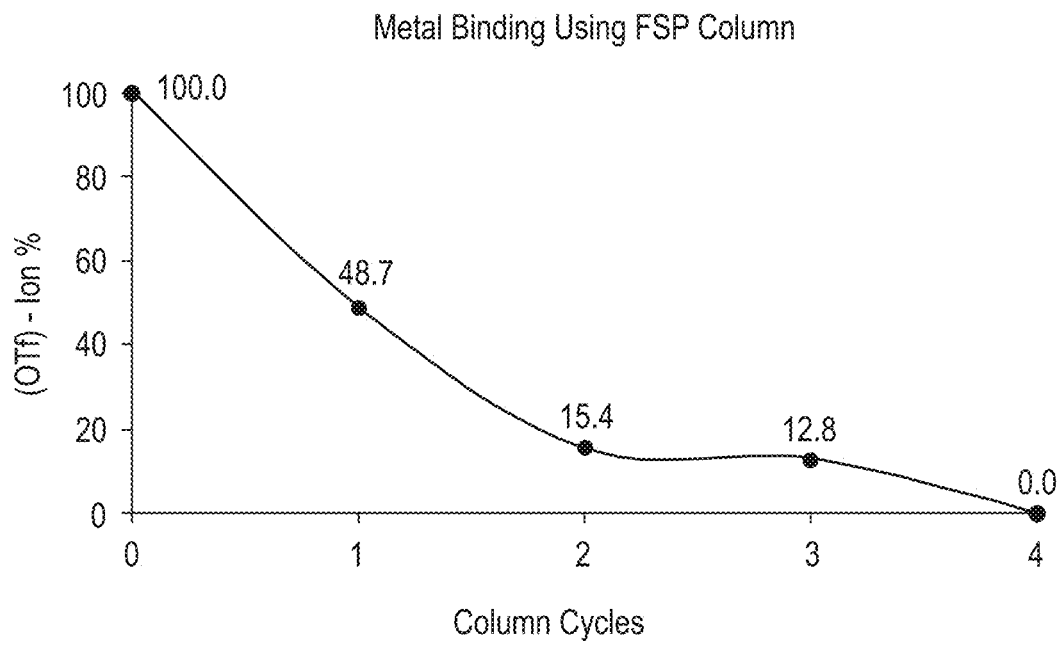
FIG. 12 is a graph plotting the areas under the peaks of FIG. 11.

FIG. 12 is a graph plotting the areas under the peaks of FIG. 11.

Chelating from Aqueous Solution

Figure 13:
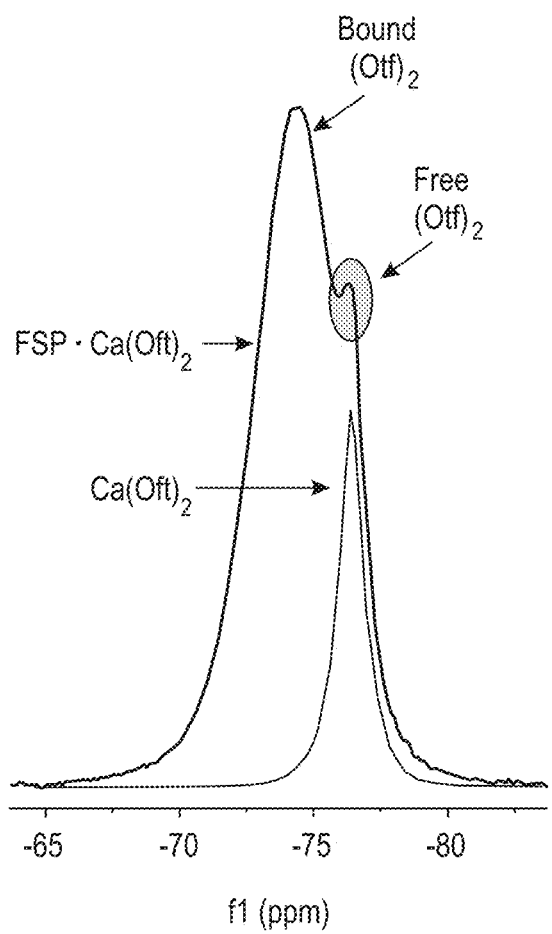
FIG. 13 is a magic angle spinning $(MAS)^{19}F$ NMR spectrum of particle FSP-1 complex with $Ca(OTf)_2$ and reference solid $Ca(OTf)_2$, acquired at 300 MHz and an MAS rate of 15 kHz. The solid mixture shows a sharp peak for free triflate anions and a broad peak for bound triflate anions.
Figure 14:
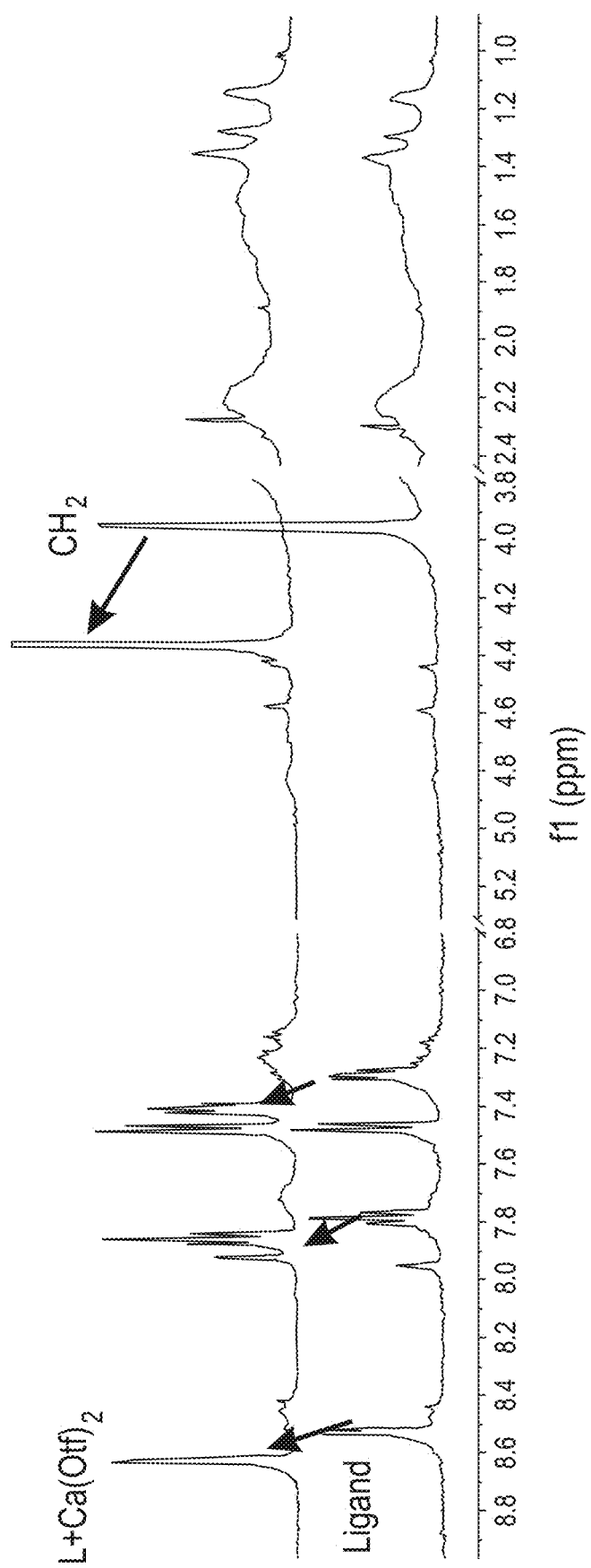
FIG. 14 is set of $^1H$ NMR spectra of isolated linear analog FSP-3 (bottom) and isolated linear analog FSP-3 complex with $Ca(Otf)_2$ (top), acquired at 300 MHz, 298 K, in DMSO-$d_6$.

Chelating metal ions from aqueous solution using the functionalized solid particles (FSPs) was investigated in both batched experiments and solid phase chromatography. In the batched processes, contacting non-protonated FSP-1 with a water solution containing calcium trifluoromethanesulfonate for only 20 minutes resulted in 67% of metal being sequestered from solution. The suspension was stirred at room temperature, then centrifuged, and the treated FSP was isolated and dried. The treated FSP bound 2.3 times its weight of calcium triflate. Solid state $^{19}F$ NMR showed a strong binding to the triflate anions as a broad peak at $\delta$ −74 ppm while the free triflate is observed as a sharp peak at $\delta$ −75 ppm (FIG. 13, NMR spectra). Due to the broadness of the $^1H$ NMR of FSP-1, a linear polymer analog FSP-3 was synthesized to monitor metal binding. The linear analog polymer FSP-3 showed a $CH_2$ proton shift $\Delta\delta$ 0.4 ppm upon the addition of calcium triflate ions (FIG. 14, NMR spectra). In order to make the adsorption processes more efficient and practicable, regeneration potential of the FSP was tested. It was observed that 55 wt % of the metal-ion bound was desorbed out of FSP-2 using distilled water at 100° C. This result indicates that the FSP is capable of adsorption and desorption of metal ions upon the manipulation of the particle's lower critical solution temperature.

Example 9. Sequestering $Cu(NO_2)_2$

Figure 15:
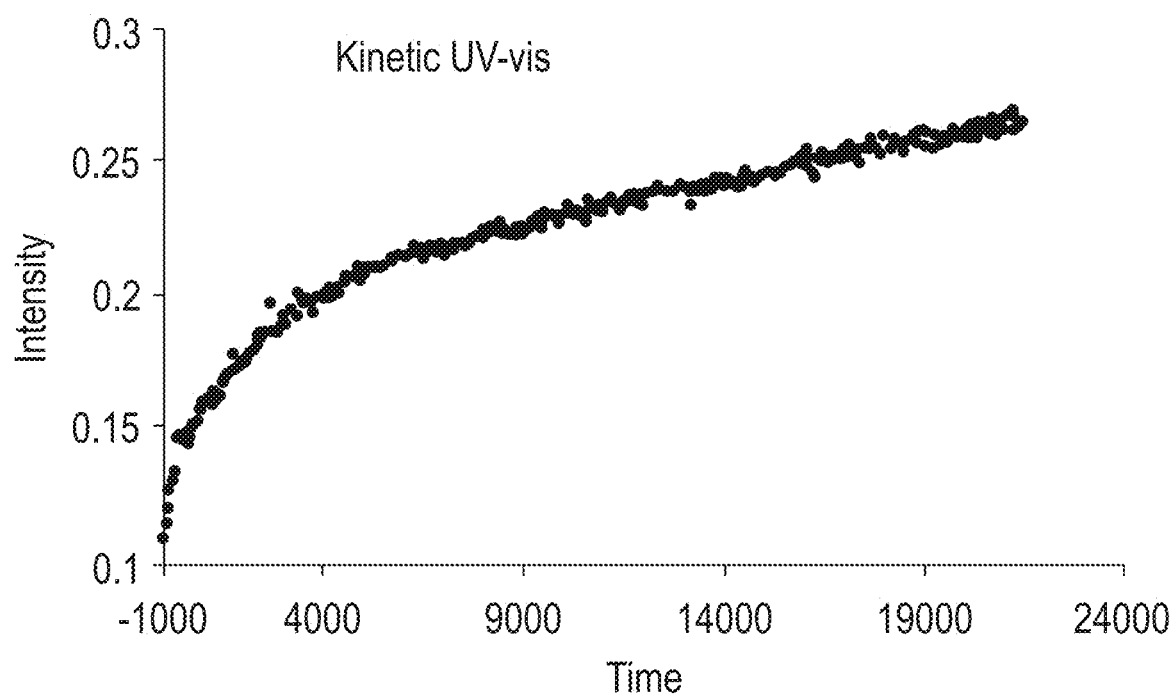
FIG. 15 is a graph of the ultraviolet-visible (UV-VIS) absorption of Example 9 at 748 nm, taken at a scan rate of 60 scans/6 hours while stirring at 50 rpm. The time axis is in seconds.

Non-protonated FSP-1 (300 mg) was swollen in water (10 mL) for 1 hour, producing a mixture containing an amber colored solid and a colorless supernatant. A clear, colorless solution of 6 mM $Cu(NO_2)_2$ (1 g) in water was added to the FSP-1 mixture. The particles and supernatant immediately began changing color to a dark blue, which intensified in color density at 748 nm over a 6 hour period due to metal-ligand exchange from $Cu[6H_2O]$ to $CU[6C_5H_4N]$ (FIG. 15, graph, scan rate 60 scans/6 hours while stirring at 50 rpm, time axis is in seconds). The copper II complex with FSP-1 was isolated as a dark blue solid. The complex was swollen in fresh water at room temperature, producing a mixture containing a dark blue solid in a colorless supernatant. The mixture was heated 5 minutes at 100° C., producing a blue supernatant, indicating release of the Cu(II) from the complex.

Other Salts

Figure 16:
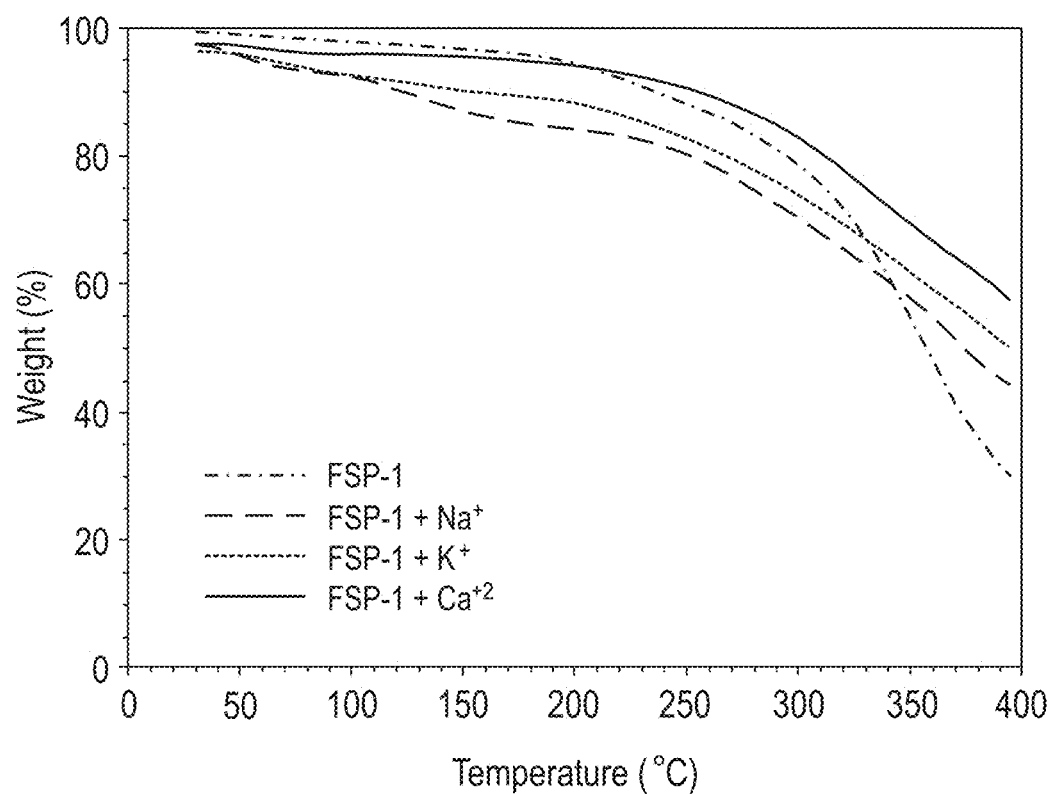
FIG. 16 is a plot of thermogravimetric analysis (TGA) curves of protonated FSP-1 treated with sodium acetate, potassium carbonate, and calcium triflate compared to untreated protonated FSB-1.

Using the same procedure described above for Example 4, non-protonated FSP-1 was separately combined with sodium acetate and potassium carbonate to form sodium and potassium ion complexes. The thermogravimetric analyses (TGA) of these complexes were similar to FSP-1 bound to calcium triflate (FIG. 16).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A particle, comprising:
a branched polymer network, the polymer network comprising i) a first moiety comprising a covalently bound form of a poly(ethylenimine) (PEI), ii) a second moiety comprising a covalently bound form of a polyacid, the polyacid comprising carboxylic acid groups, iii) a third moiety comprising a covalently bound form of di-2-picolylamine, and iv) a fourth moiety comprising a covalently bound form of an amino acid; wherein the first moiety, second moiety, third moiety, and fourth moiety are covalently bound to the polymer network.

2. The particle of claim 1, wherein the particle has an average pore size of about 10-40 microns in an aqueous solution.

3. The particle of claim 1, wherein the particle is capable of sequestering metal ions from an aqueous solution.

4. The particle of claim 1, wherein the PEI is a branched poly(ethylenimine).

5. The particle of claim 1, wherein the PEI is a linear poly(ethylenimine).

6. The particle of claim 1, wherein the first moiety is covalently linked to the second moiety by a primary or secondary amide group.

7. The particle of claim 1, wherein the polyacid is a member selected from the group consisting of poly(acrylic acid), poly(methacrylic acid), and poly(styrene carboxylic acid).

8. The particle of claim 1, wherein the covalently bound form of the amino acid is a member selected from the group consisting of

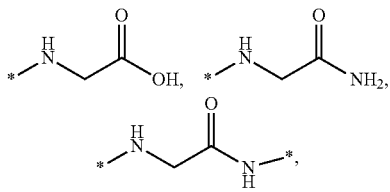

and combinations thereof.

9. The particle of claim 1, wherein the covalently bound form of di-2-picolylamine is

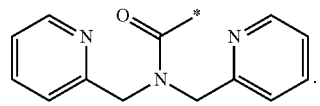 [SMILES: *C(=O)N(Cc1ccccn1)Cc1ccccn1]

10. A particle, comprising:
a branched polymer network comprising i) a first moiety comprising a covalently bound form of a poly(ethylenimine) (PEI), ii) a second moiety comprising a covalently bound form of a polyacid, the polyacid comprising a pendant carboxylic acid group, iii) a third moiety comprising a covalently bound form of di-2-picolylamine; and iv) a fourth moiety comprising a covalently bound form of a thermoresponsive polymer having a critical solution temperature in water;
wherein the first moiety, the second moiety, the third moiety, and the fourth moiety are covalently bound to the branched polymer network.

11. The particle of claim 10, wherein the thermoresponsive polymer comprises a pendant functional group selected from the group consisting of N-isopropyl amide, N-tert-butyl amide, N-sec-butyl amide, and combinations thereof.

12. The particle of claim 10, wherein the thermoresponsive polymer has a lower critical solution temperature in water at a temperature in the range of 30° C. to 100° C.

13. The particle of claim 10, wherein the thermoresponsive polymer is a poly(N-isopropyl acrylamide) linked by an amide group to the network.

14. A method, comprising:
forming a mixture comprising a poly(ethylenimine), a polyacid comprising a pendant carboxylic acid group, di-2-picolylamine, glycine, a solvent, and a catalytic amount of N,N-dimethylformamide based on total moles of carboxylic acid of the mixture; and
heating the mixture while removing water, thereby forming a branched polymer network comprising a covalently bound form of each of the poly(ethylenimine), the polyacid, the di-2-picolylamine, and the glycine covalently linked directly or indirectly in the polymer network.

15. The method of claim 14, wherein the water is removed azeotropically.

16. A method, comprising:
forming a mixture comprising a poly(ethylenimine), a polyacid comprising a pendant carboxylic acid group, di-2-picolylamine, a thermoresponsive polymer having a critical solution temperature in water, a solvent, and a catalytic amount of N,N-dimethylformamide; and
heating the mixture while removing water, thereby forming a branched polymer network, wherein the poly(ethylenimine), the polyacid, the di-2-picolylamine, and the thermoresponsive polymer are covalently bound to the polymer network.

17. The method of claim 16, wherein the thermoresponsive polymer is poly(N-isopropyl acrylamide) having a terminal carboxyl group.

18. A method, comprising:
contacting the particle of claim 10 with an aqueous mixture comprising a metal ion, thereby forming a metal ion complex, wherein the metal ion complex comprises the metal ion bound non-covalently to the particle.

19. The method of claim 18, wherein the method comprises filtering the aqueous mixture through a layer containing the particle, thereby removing the metal ion from the aqueous mixture.

20. The method of claim 18, wherein the method comprises heating the metal ion complex in water, thereby releasing the metal ion.

21. The method of claim 18, wherein the metal ion is an ion of a metal selected from the group consisting of lithium, sodium, potassium, rubidium, caesium, francium, beryllium, magnesium, calcium, strontium, barium, radium, aluminum, gallium, indium, thallium, germanium, tin, lead, arsenic, antimony, bismuth, tellurium, polonium, scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, lawrencium, rutherfordium, dubnium, seaborgium, bohrium, hassium, meitnerium, darmstadtium, roentgenium, copernicium, and combinations thereof.

22. A polymer network, comprising:
(i) a first repeat unit comprising an amine;
(ii) a second repeat unit comprising a carboxylic acid; and
(iii) a third repeat unit comprising an amide of di-2-picolylamine;
wherein
the polymer network comprises polymer chains cross-linked by amide-containing crosslink groups,
the first repeat unit, the second repeat unit, and the third repeat unit are covalently bound to the polymer network, and
the polymer network is capable of sequestering metal ions from aqueous solution.

23. The polymer network of claim 22, wherein the polymer chains comprise covalently bound forms of poly(ethylenimine) and poly(acrylic acid).

24. A method, comprising contacting the polymer network of claim 22 with an aqueous mixture containing metal ions, thereby forming a complex comprising the polymer network bound by non-covalent interactions to the metal ions.

25. The method of claim 24, wherein said contacting is performed using a batch process.

26. The method of claim 24, wherein said contacting is performed using a filtration process.

27. The method of claim 24, wherein thermal manipulation is employed to release the metal ions from the complex, thereby regenerating the polymer network.

* * * * *